(12) United States Patent
Karda et al.

(10) Patent No.: US 9,269,899 B1
(45) Date of Patent: Feb. 23, 2016

(54) ELECTRONIC DEVICE, MEMORY CELL, AND METHOD OF FLOWING ELECTRIC CURRENT

(71) Applicant: Micron Technology, Inc., Boise, ID (US)

(72) Inventors: Kamal M. Karda, Boise, ID (US); Marko Milojevic, Boise, ID (US); David H. Wells, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/615,188

(22) Filed: Feb. 5, 2015

(51) Int. Cl.
*G11C 5/12* (2006.01)
*H01L 45/00* (2006.01)
*G11C 13/00* (2006.01)

(52) U.S. Cl.
CPC ............... *H01L 45/126* (2013.01); *G11C 5/12* (2013.01); *G11C 13/0002* (2013.01); *G11C 13/0004* (2013.01); *H01L 45/06* (2013.01); *H01L 45/08* (2013.01); *H01L 45/1233* (2013.01); *H01L 45/146* (2013.01)

(58) Field of Classification Search
CPC ........................................................ G11C 5/12
USPC ........................................................ 365/148
See application file for complete search history.

(56) References Cited

U.S. PATENT DOCUMENTS

| | | | |
|---|---|---|---|
| 2007/0274121 A1* | 11/2007 | Lung | G11C 11/5678 365/148 |
| 2009/0251950 A1* | 10/2009 | Klostermann | G11C 11/16 365/158 |
| 2009/0296449 A1* | 12/2009 | Slesazeck | G11C 5/02 365/148 |
| 2014/0029327 A1* | 1/2014 | Strachan | H01L 45/04 365/148 |
| 2014/0301127 A1* | 10/2014 | Kim | G11C 13/0004 365/148 |

OTHER PUBLICATIONS

Activation Energy for Solids?; www.researchgate.net/post/Activation_energy_for_solids . . . May 18, 2013; 1 p.
Activation Energy; The Free Dictionary; www.thefreedictionary.com/Thermal+activation . . . ; downloaded 2002; 1 p.
Dilli, Z.; Enee 313, Spr. '09, Supplement I, Intrinsic and Extrinsic Semiconductors, Fermi-Dirac Distribution Function, the Fermi level and carrier concentrations; Mar. 2009; pp. 1-8.
Musa et al.; Determined the energy gap and activation energies of some transition metal complexes of liquid crystalline Schiff base.; National Journal of Chemistry ; vol. 30; 2008; pp. 323-329.
Thermal Activation-Definition and More from the Free Merriam-Webster Dictionary; www.merriam-webster dictionary.com/dictionary/activation%20energy . . . ; downloaded Dec. 8, 2014; 2 pp.
Tominaga et al.; What is the Origin of Activation Energy in Phase-Change Film?; Japanese Journal of Applied Physics 48; 2009; 03A053-1-03A053-3.

* cited by examiner

*Primary Examiner* — Hoai V Ho
*Assistant Examiner* — Jay Radke
(74) *Attorney, Agent, or Firm* — Wells St. John, P.S.

(57) ABSTRACT

An electronic device includes two conductive electrodes. A first current path extends from one of the electrodes to the other and has a dominant thermally activated conduction activation energy of 0.5 eV to 3.0 eV. A second current path extends from the one electrode to the other and is circuit-parallel the first current path. The second current path exhibits a minimum 100-times increase in electrical conductivity for increasing temperature within a temperature range of no more than 50° C. between 300° C. and 800° C. and exhibits a minimum 100-times decrease in electrical conductivity for decreasing temperature within the 50° C. temperature range. Other embodiments are disclosed.

35 Claims, 5 Drawing Sheets

ELECTRONIC DEVICE, MEMORY CELL, AND METHOD OF FLOWING ELECTRIC CURRENT

TECHNICAL FIELD

Embodiments disclosed herein pertain to electronic devices, to memory cells, and to methods of flowing electric current.

BACKGROUND

Electronic devices are components of integrated circuitry. One such device includes two conductive electrodes having a material of lower conductance there-between. A sufficient voltage differential between the two electrodes can cause current to flow from one of the electrodes to the other through the lower conductance material.

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information. One type of memory cell includes a select device electrically coupled in series with a memory device that stores the data.

DETAILED DESCRIPTION OF EXAMPLE EMBODIMENTS

Figure 1:
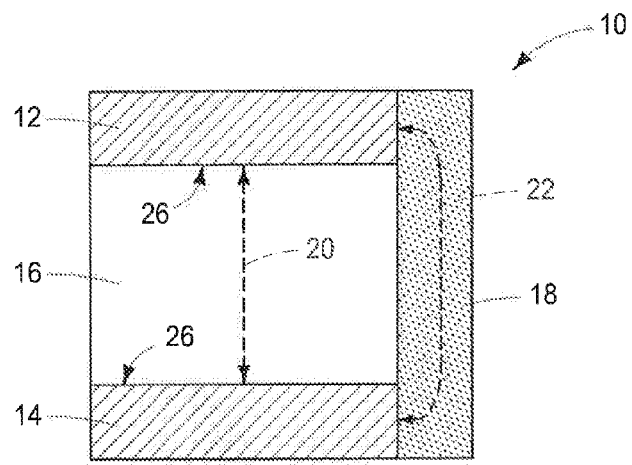
FIG. 1 is a diagrammatic sectional view of a portion of an electronic device in accordance with an embodiment of the invention.

An electronic device 10 in accordance with an embodiment of the invention is shown and initially described with reference to FIG. 1. Electronic device 10 comprises two conductive (i.e., electrically) electrodes 12 and 14 having a first material 16 and second material 18 there-between. Electronic device 10 comprises a first current (i.e., electrical) path 20 from one of electrodes 12 or 14 to the other that has a dominant thermally activated conduction activation energy of 0.5 eV to 3.0 eV. Electronic device 10 comprises a second current path 22 from the one electrode 12 or 14 to the other that is circuit-parallel first current path 20. Second current path 22 exhibits a minimum 100-times increase in electrical conductivity (i.e., at least 100 times more conductivity) for increasing temperature within a temperature range of no more than 50° C. between 300° C. and 800° C. Further, second current path 22 exhibits a minimum 100-times decrease in electrical conductivity for decreasing temperature within the 50° C. temperature range. In one embodiment, such respective increase and decrease in electrical conductivity within the 50° C. temperature range is a minimum of 1,000-times, and in one embodiment a minimum of 10,000-times. In one embodiment, the 50° C. temperature range is entirely within a range of 400° C. to 500° C. and in one embodiment entirely within a range of 500° C. to 600° C. In one embodiment, the minimum 100-times increase and decrease in conductivity in the second current path are independent of rate of temperature change within the 50° C. temperature range. In one embodiment, second current path 22 in the minimum 100-times increased state has conductivity of at least 10 Siemens/cm. In one embodiment, the second current path has conductivity of no more than 0.1 Siemens/cm below 300° C. In one embodiment, the temperature range within which the minimum 100-times increase in conductivity and the minimum 100-times decrease in conductivity in the second current path occurs is no more than 35° C. between 300° C. and 800° C., and in one embodiment is no more than 25° C. between 300° C. and 800° C.

First current path 20 is shown as being encompassed by or within first material 16 to and between electrodes 12 and 14. Second current path 22 is shown as being encompassed by or within second material 18 to and between electrodes 12 and 14. Example first materials 16 include one or more of amorphous silicon, polycrystalline silicon, germanium, and chalcogenide glass. First material 16, and thereby first current path 20, may predominantly (i.e., more than 50 atomic %) comprise such material(s). Any of these materials may be doped or undoped to provide desired overall electrical resistance/conductance for first current path 20. Further, unless otherwise indicated, any of the materials and/or structures described herein may be homogenous or non-homogenous, and regardless may be continuous or discontinuous over any material which such overlie. Further, unless otherwise indicated, each material may be formed using any suitable existing or yet-to-be-developed technique, with atomic layer deposition, chemical vapor deposition, physical vapor deposition, epitaxial growth, diffusion doping, and ion implanting being examples. In one embodiment, the second current path where between electrodes 12 and 14 is homogenous, and in one embodiment is non-homogenous. In one embodiment, the first current path where between electrodes 12 and 14 is homogenous, and in one embodiment is non-homogenous. In an embodiment where first material 16 and thereby first current path 20 are non-homogenous, first current path 20 may have multiple thermally activated conduction activation energies due to different composition materials therein having different such activation energies. Yet, first current path 20 will still have a dominant (meaning controlling) such activation energy of 0.4 eV to 3.0 eV likely dependent on the respective volumes of the individual different materials within first current path 20. Accordingly and regardless, "dominant" is used and applies herein regardless of homogeneity of the particular path/material.

Example second materials 18 comprise Mott insulators (e.g., certain vanadium oxides, titanium oxides, yttrium-titanium oxides, yttrium-vanadium oxides, and lanthanum-titanium oxides) and one or more transition metal oxides (i.e., regardless of whether being a Mott insulator). Second material 18, and thereby parallel second current path 22, may predominantly comprise such material(s). Further, any of such materials may be doped or undoped to provide desired overall electrical resistance/conductance and change relative thereto within the 50° C. temperature range where the minimum 100-times conductivity change occurs. As but one specific example, $V_2O_5$ (a Mott insulator) will exhibit a reversible approximate 10,000+-times change in electrical conductivity for increasing and decreasing temperature within a range of 410° C. to 435° ° C. Other materials may of course be used and/or combined with $V_2O_5$, for example, to achieve a minimum 100-times conductivity change within other 50° C. maximum temperature ranges between 300° C. and 800° C. Composition and structure of first material 16 may be selected to provide heating to within the 50° C. temperature range in a sufficiently short time (e.g., measured in nanoseconds) for chosen operating voltages and differential(s) there-between at electrodes 12 and 14.

Example conductive materials for electrodes 12 and 14 include one or more of elemental metal, an alloy of two or more elemental metals, conductive metal compounds, and conductively doped semiconductive material. An example thickness for each of electrode 12, electrode 14, and first material 16 is 25 to 300 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness unless otherwise indicated.

Figure 2:
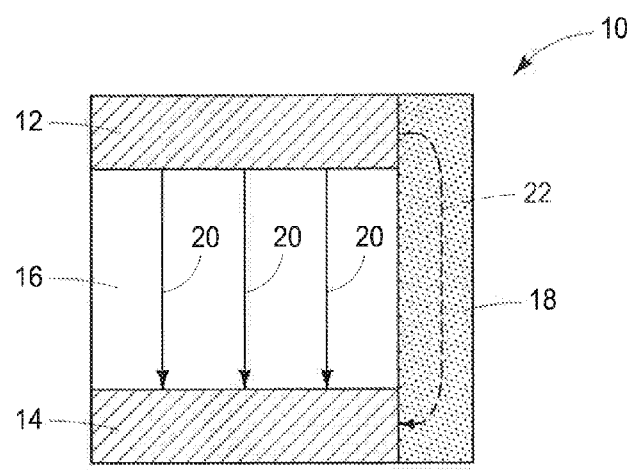
FIG. 2 is a view of the FIG. 1 electronic device diagrammatically depicting an operating state thereof.

Example operational characteristics of electronic device 10 are next described with reference to FIGS. 2 and 3. Referring to FIG. 2, a suitable voltage differential has been applied relative to electrodes 12 and 14 to cause current flow from electrode 12 to electrode 14 (as one example), thereby flowing current through first current path 20 which is now illustrated by multiple solid-line arrows labeled with numeral 20. Voltage differential between electrodes 12 and 14, and thereby current flowing through first current path 20, is configured to be sufficient to heat second current path 22 to within the 50° C. temperature range in which the minimum 100-times increase in conductivity occurs. FIG. 2 shows an initial or prior state wherein current is flowing through first current path 20 but has not been sufficient in magnitude and/or time to cause such minimum 100-times conductivity increase within second material 18. Thereby, second current path 22 is shown as a single dashed line wherein negligible, if any, current flows there-through due to considerably lower electrical resistance within first current path 20 compared to second current path 22.

Figure 3:
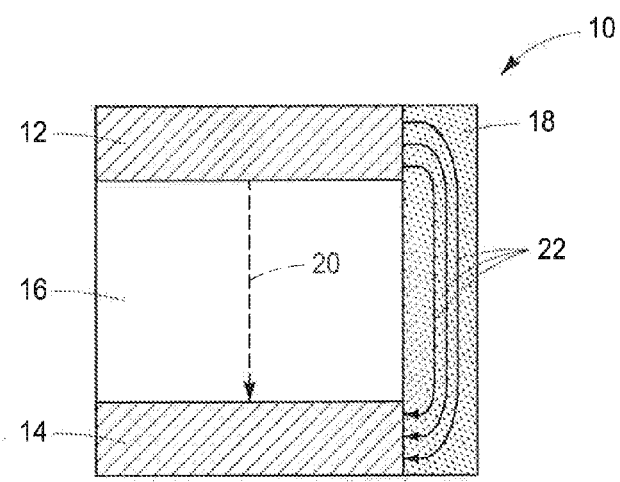
FIG. 3 is a view of the FIG. 1 electronic device diagrammatically depicting an operating state thereof.

FIG. 3 is intended to diagrammatically illustrate what occurs upon reaching a transition temperature or transition temperature range that is within the 50° C. temperature range for increasing temperature whereupon the minimum 100-times conductivity increase has occurred. Specifically in this example, first material 16 has been heated sufficiently to heat second material 18 to an increasing suitable temperature therein that is within the 50° C. range where transition to high conductivity has occurred, and which is then higher than conductivity of material 16. Thereby, current flow through second material 18, and thereby through second current path 22, has become greater than that (if any) flowing through first current path 20. Such is diagrammatically depicted in FIG. 3 by multiple solid-line second current path arrows 22 and by only a single dashed-line arrow for first current path 20. All of second material 18 might be sufficiently heated to the transition temperature or transition temperature range whereby second current path 22 encompasses all of second material 18. Alternately as an example, only a smaller portion of second material 18 may be sufficiently heated whereby second current path 22 in its highest conductive state constitutes only a portion of second material 18 that is closest to first material 16 and thereby to first current path 20.

Regardless, at that time, such reduced (if any) current flow through first current path 20 results in temperature within first material 16 dropping, whereby temperature within second material 18 will also drop. Temperature within second current path 22 will thereby decrease within the 50° C. temperature range until the transition temperature or transition temperature range is reached whereby conductivity within second current path 22 decreases by a minimum 100-times. Such will in essence be a reversion to the FIG. 2 low-conductivity state in second current path 22, where-upon current starts flowing again through first current path 20 sufficient to again start to heat second current path 22. Such continues to the transition temperature or transition temperature range within the 50° C. temperature range wherein a minimum 100-times increase in conductivity occurs in second current path 22, thus back to the FIG. 3 highest-conductivity state. Such may repeat and continue as long as a sufficient voltage differential is maintained between electrodes 12 and 14. Accordingly, electronic device 10 may act as a temperature-limiting and as a current density-limiting device. Depending upon material composition, construction, and/or applied voltages, electronic device 10 may essentially operate to produce largely continuous current flow between electrodes 12 and 14 at the transition temperature or transition temperature range. Alternately, electronic device 10 may essentially operate to largely produce and send discrete current pulses between electrodes 12 and 14 at the transition temperature or transition temperature range.

Figure 4:
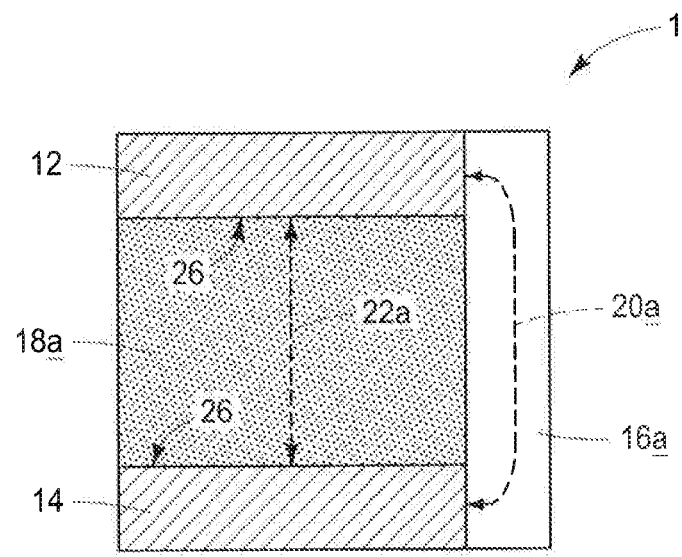
FIG. 4 is a diagrammatic sectional view of a portion of an electronic device in accordance with an embodiment of the invention.

FIG. 1 illustrates but one example construction for electronic device 10. Alternate existing or yet-to-be-developed constructions may be used, with some examples being shown in subsequent figures and described below. For example, FIG. 4 shows an alternate embodiment electronic device 10a. Like numerals from the above-described embodiments have been used where appropriate, with some construction differences being indicated with the suffix "a". In FIG. 4, the relative positions of the first material and the second material have been reversed in comparison to that of FIG. 1. Thereby, first current path 20a and second current path 22a have been reversed within respective depicted materials 16a and 18a. The construction of FIG. 4 may be less likely to sufficiently heat all of second material 18a in comparison to all of 18 in the FIG. 1 construction. Regardless, any other attribute(s) or construction(s) as described above may be used.

Figure 5:
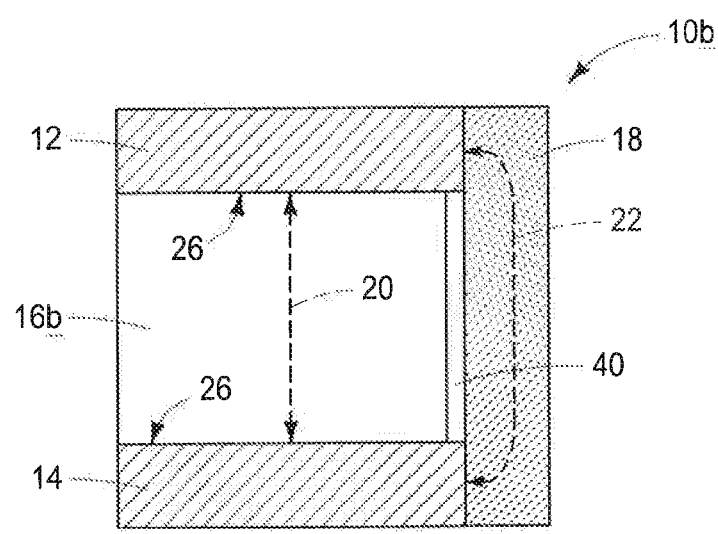
FIG. 5 is a diagrammatic sectional view of a portion of an electronic device in accordance with an embodiment of the invention.

The FIGS. 1 and 4 embodiments show first material 16/16a and second material 18/18a being directly against one another, whereby first current path 20/20a and second current path 22/22a are directly against one another. In this document, a material, path, or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. If two stated materials are not directly against one another, a material of different composition is there-between. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. FIG. 5 shows an alternate embodiment electronic device 10b wherein the first and second current paths are not directly against one another. Like numerals from the above-described embodiments have been used where appropriate, with some construction differences being indicated with the suffix "b" or with different numerals. Electronic device 10b has a barrier material 40 physically everywhere between first material 16b and second material 18. Example barrier materials 40 include dielectrics (e.g., silicon dioxide and/or silicon nitride), for example having a band-gap of at least 5.0 eV. Any other attribute(s) or construction(s) as described above may be used.

Each of electrodes 12 and 14 may be considered as having a surface 26 that faces the other electrode. In one embodiment, the first current path is directly against each of such surfaces (e.g., first current path 20 in FIG. 1 being directly against each of surfaces 26 due to first material 16 being directly against surfaces 26). In one embodiment, the first current path is not directly against each of such surfaces (e.g., first current path 20a in FIG. 4 not being directly against surfaces 26 since first material 16a is not directly against surfaces 26). In one embodiment, the second current path is directly against each of such surfaces (e.g., second current path 22a in FIG. 4 being directly against each of surfaces 26 due to second material 18a being directly against surfaces 26). In one embodiment, the second current path is not directly against each of such surfaces (e.g., second current path 22 in FIG. 1 not being directly against surfaces 26 as second material 18 is not directly against surfaces 26).

Figure 6:
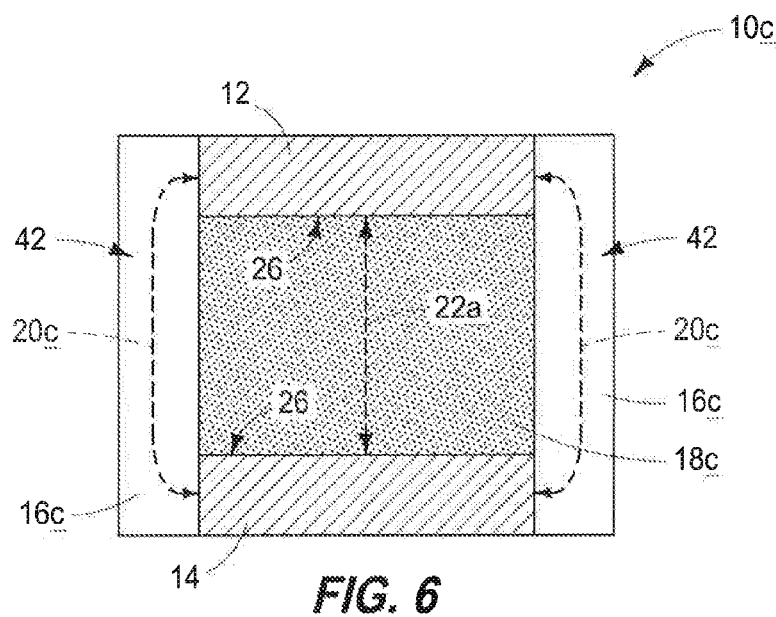
FIG. 6 is a diagrammatic sectional view of a portion of an electronic device in accordance with an embodiment of the invention.
Figure 7:
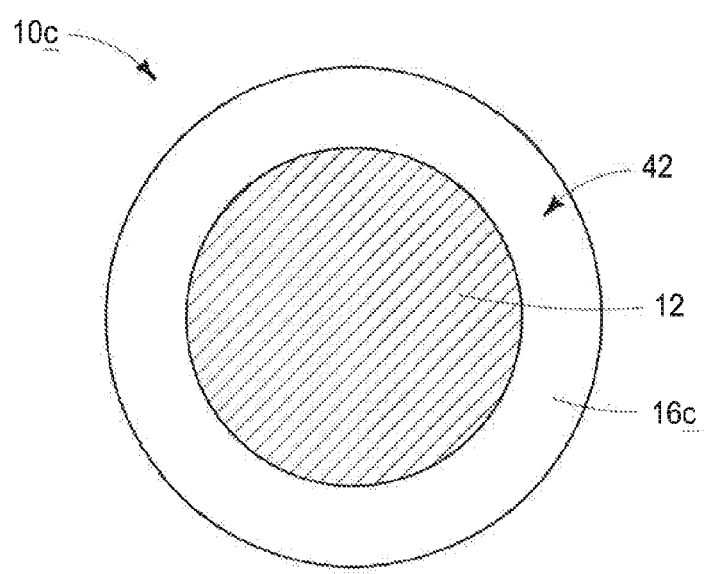
FIG. 7 is a top view of an electronic device of the FIG. 6 construction.

Another example alternate embodiment electronic device 10c is shown in FIGS. 6 and 7. Like numerals from the above-described embodiments have been used where appropriate, with some construction differences being indicated with the suffix "c" or with different numerals. In electronic device 10c, first current path 20c comprises an annulus 42 that is circumferentially about second current path 22a due to first material 16c being in the shape of an annulus. In one such embodiment, annulus 42 is also circumferentially about each of electrodes 12 and 14, for example as shown. Any other attribute(s) or construction(s) as described above may be used.

Figure 8:
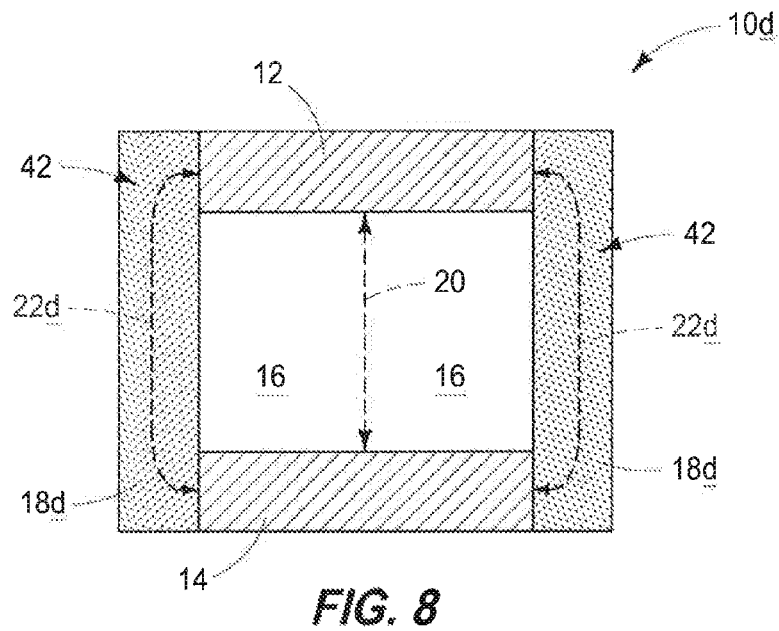
FIG. 8 is a diagrammatic sectional view of a portion of an electronic device in accordance with an embodiment of the invention.
Figure 9:
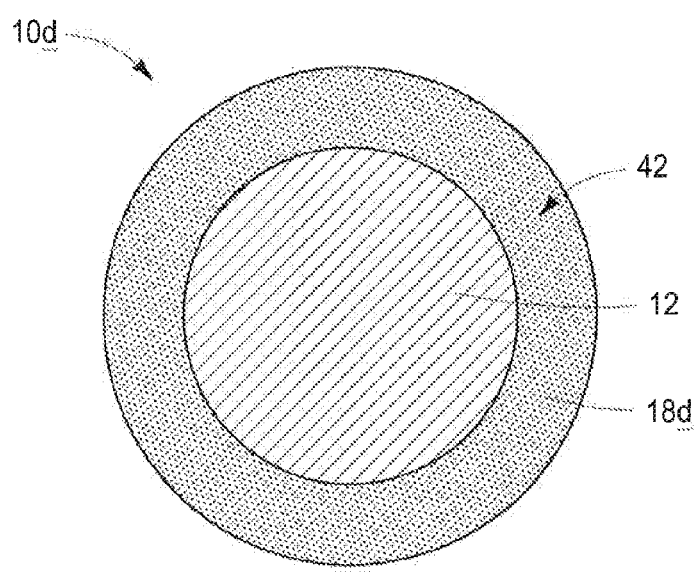
FIG. 9 is a top view of an electronic device of the FIG. 8 construction.

The component relationships of the FIGS. 6 and 7 construction can be reversed, for example as shown with respect to an alternate embodiment electronic device 10d in in FIGS. 8 and 9. Like numerals from the above-described embodiments have been used where appropriate, with some construction differences being indicated with the suffix "d". In electronic device 10d, second current path 22d comprises an annulus 42 that is circumferentially about first current path 20 due to the construction relationships of material 16 and 18d. In one embodiment, annulus 42 is circumferentially about each of two electrodes 12 and 14, for example as shown. Any other attribute(s) or construction(s) as described above may be used.

Figure 10:
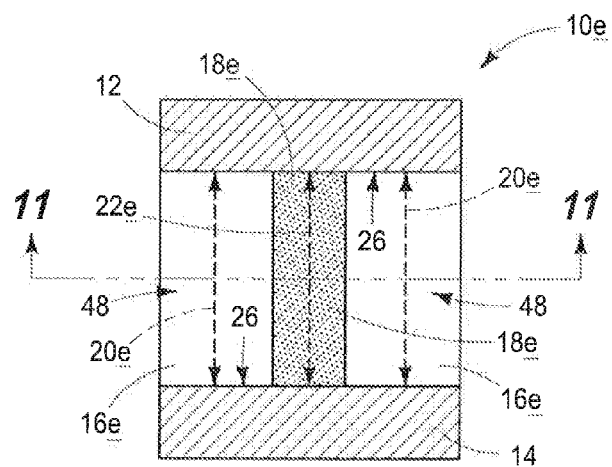
FIG. 10 is a diagrammatic sectional view of a portion of an electronic device in accordance with an embodiment of the invention.
Figure 11:
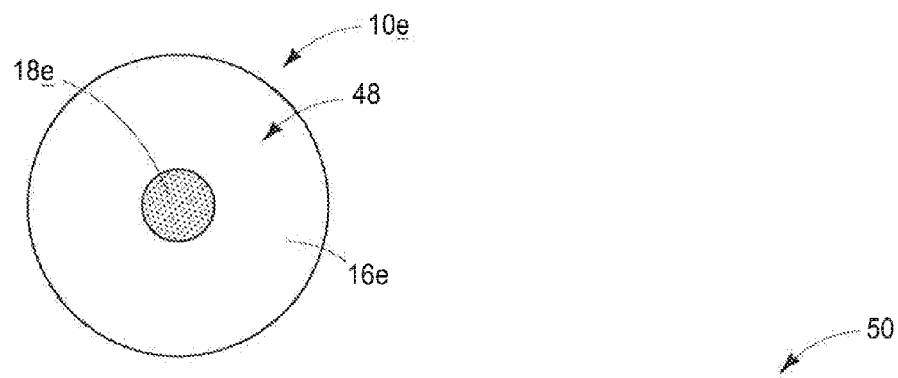
FIG. 11 is a top view of an electronic device of the FIG. 8 construction.

Another example alternate embodiment electronic device 10e is shown in FIGS. 10 and 11. Like numerals from the above-described embodiments have been used where appropriate, with some construction differences being indicated with the suffix "e" or with different numerals. In electronic device 10e, first current path 20e and second current path 22e are directly against each of surfaces 26 due to first material 16e and second material 18e being directly against surfaces 26. Further, first current path 20e comprises an annulus 48 that is circumferentially about second current path 22e. Such relationships could of course be reversed whereby second material 18e/second current path 22e are formed as the annulus and first material 16e/first current path 20e are formed centrally thereof (not shown). Regardless, any other attribute(s) or construction(s) as described above may be used.

Each of the above embodiments shows the respective electronic device as being a vertical device, and with the first and second conductive paths being laterally aside (i.e., in at least one straight-line cross section) one another. In the context of this document, a vertical device is characterized by predominant current flow there-through orthogonal to a primary/major horizontal outermost surface of a substrate in or on which the device lies, and independent of orientation of such substrate in three dimensional space. Alternate constructions may of course be used, for example horizontal devices, diagonal devices, one or more combinations thereof, etc. where such orientations refer to direction of current flow relative to such surface independent of orientation of such substrate in three dimensional space.

Figure 12:
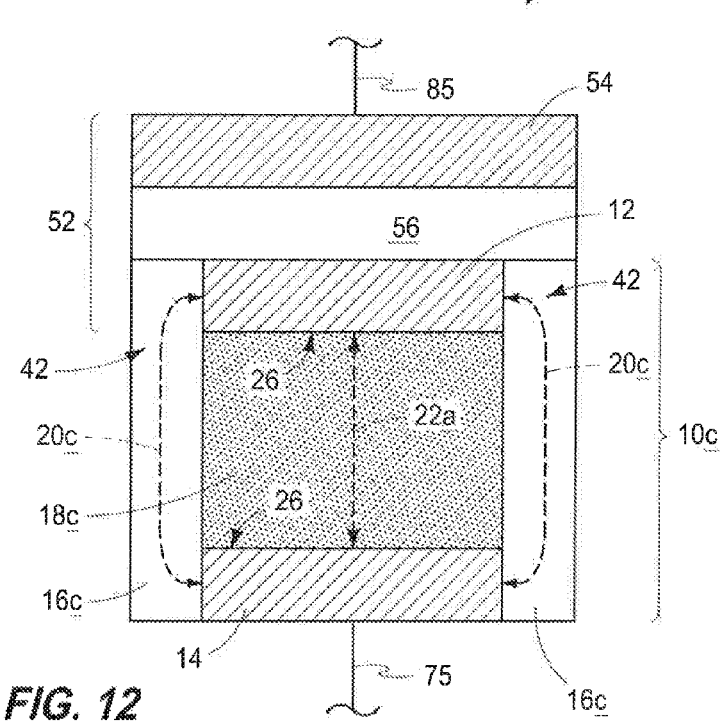
FIG. 12 is a diagrammatic sectional view of a portion of a memory cell in accordance with an embodiment of the invention.

Embodiments of the invention include a memory cell that incorporates any of the above-described electronic devices as a select device in such memory cell. One such example memory cell 50 is shown and described with reference to FIG. 12. Like numerals from the above-described embodiments have been used where appropriate, with some construction differences being indicated with different numerals. Example memory cell 50 comprises a programmable memory device 52 electrically coupled in series with a select device (e.g., select device 10c). Although the select device in example memory cell 50 is shown and described with respect to electronic device 10c of FIGS. 6 and 7, any other select device of the FIGS. 1, 4-5, 8-11, or other, constructions may be used. Further, any existing or yet-to-be developed programmable memory device may be used. Programmable memory device 52 is shown as comprising two conductive electrodes 54 and 12 having programmable material 56 there-between, and in one embodiment wherein one of such electrodes (e.g., electrode 12) constitutes a same and shared electrode of select device 10c and programmable memory device 52. Suitable programmable materials have two or more selectable memory states to enable storing of information by an individual memory cell. The reading of the cell comprises determination of which of the states the programmable material is in, and the writing of information to the cell comprises placing the programmable material into a predetermined state. Some programmable materials retain a memory state in the absence of refresh, and thus may be incorporated into non-volatile memory cells. Any existing or yet-to-be-developed programmable material 56 may be used. In one embodiment, programmable memory device 52 is non-volatile.

Integrated circuitry (not shown) having a memory cell 50 would likely have thousands or millions of such memory cells fabricated relative to a memory array or sub-array, and are not particularly material to the disclosure herein. Such arrays or sub-arrays would likely have a plurality of access lines and select lines having individual memory cells 50 there-between where such cross. Individual memory cells may be considered as comprising the portions of an individual access line and a crossing individual select line. For example, electrode 14 of select device 10c may connect with or comprise part of an access or select line as or via a conductive path 75, and electrode 54 of memory device 52 may connect with or comprise part of the other of an access or select line as or via a conductive path 85.

In one embodiment, memory device 52 comprises a ferroelectric capacitor, for example wherein programmable material 56 is a ferroelectric material. Example ferroelectric materials 19 include ferroelectrics that have one or more of transition metal oxide, zirconium, zirconium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare earth element. Two specific examples are $Hf_xSi_yO_z$ and $Hf_xZr_yO_z$. Any other attribute(s) or construction(s) as described above may be used.

An embodiment of the invention includes a method of flowing current. Such a method comprises operating two circuit-parallel current paths that exist between two electrodes. One of the current paths exhibits a minimum 100-times increase in electrical conductivity for increasing temperature within a temperature range of no more than 50° C. between 300° C. and 800° C. Such current path also exhibits a minimum 100-times decrease in electrical conductivity for decreasing temperature within the 50° C. temperature range. The operating comprises sequentially iterating the following:
  a) flowing current through the other current path between the two electrodes sufficient to heat the one current path within the 50° C. temperature range to increase conductivity in the one path by the minimum 100-times and which is then greater than any current flowing through the other current path; and
  b) reduced, if any, current flow through the other current path lowers temperature within the other current path until temperature within the one current path decreases within the 50° C. temperature range to decrease conductivity in the one path by the minimum 100-times.

Any other attribute(s) or construction(s) as described above may be used in carrying out methods in accordance with the invention.

Conclusion

In some embodiments, an electronic device comprises two conductive electrodes. A first current path extends from one of the electrodes to the other and has a dominant thermally activated conduction activation energy of 0.5 eV to 3.0 eV. A second current path extends from the one electrode to the other and is circuit-parallel the first current path. The second current path exhibits a minimum 100-times increase in electrical conductivity for increasing temperature within a temperature range of no more than 50° C. between 300° C. and 800° C. and exhibits a minimum 100-times decrease in electrical conductivity for decreasing temperature within the 50° C. temperature range.

In some embodiments, a memory cell comprises a programmable memory device electrically coupled in series with a select device. The select device comprises two conductive electrodes. A first current path extends from one of the electrodes to the other and has a dominant thermally activated conduction activation energy of 0.5 eV to 3.0 eV. A second current path extends from the one electrode to the other and is circuit-parallel the first current path. The second current path exhibits a minimum 100-times increase in electrical conductivity for increasing temperature within a temperature range of no more than 50° C. between 300° C. and 800° C. and exhibits a minimum 100-times decrease in electrical conductivity for decreasing temperature within the 25° C. temperature range.

In some embodiments, a method of flowing electric current comprises operating two circuit-parallel current paths that exist between two electrodes. One of the current paths exhibits a minimum 100-times increase in electrical conductivity for increasing temperature within a temperature range of no more than 50° C. between 300° C. and 800° C. and exhibits a minimum 100-times decrease in electrical conductivity for decreasing temperature within said 50° C. temperature range. The operating comprises sequentially iterating the following (a) and (b): (a) flowing current through the other current path between the two electrodes sufficient to heat the one current path within said 50° C. temperature range to increase conductivity in the one path by said minimum 100-times and which is then greater than any current flowing through the other current path; and (b) reduced, if any, current flow through the other current path lowers temperature within the other current path until temperature within the one current path decreases within said 50° C. temperature range to decrease conductivity in the one path by said minimum 100-times.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. An electronic device, comprising:
  two conductive electrodes;
  a first current path from one of the electrodes to the other that has a dominant thermally activated conduction activation energy of 0.5 eV to 3.0 eV; and
  a second current path from the one electrode to the other that is circuit-parallel the first current path, the second current path exhibiting a minimum 100-times increase in electrical conductivity for increasing temperature within a temperature range of no more than 50° C. between 300° C. and 800° C. and exhibiting a minimum 100-times decrease in electrical conductivity for decreasing temperature within said 50° C. temperature range.

2. The device of claim 1 wherein the minimum 100-times increase in conductivity and the minimum 100-times decrease in conductivity in the second current path is independent of rate of temperature change within said 50° C. temperature range.

3. The device of claim 1 wherein the second current path in the minimum 100-times increased state has conductivity of at least 10 Siemens/cm.

4. The device of claim 1 wherein the second current path exhibits a minimum 1,000-times increase in electrical conductivity for increasing temperature within said 50° C. temperature range and a minimum 1,000-times decrease in electrical conductivity for decreasing temperature within said 50° C. temperature range.

5. The device of claim 1 wherein the second current path exhibits a minimum 10,000-times increase in electrical conductivity for increasing temperature within said 50° C. temperature range and a minimum 10,000-times decrease in electrical conductivity for decreasing temperature within said 50° C. temperature range.

6. The device of claim 1 wherein the 50° C. temperature range is entirely within a range of 400° C. to 500° C.

7. The device of claim 1 wherein the 50° C. temperature range is entirely within a range of 500° C. to 600° C.

8. The device of claim 1 wherein said temperature range within which the minimum 100-times increase in conductivity and the minimum 100-times decrease in conductivity in the second current path occurs is no more than 35° C. between 300° C. and 800° C.

9. The device of claim 1 wherein said temperature range within which the minimum 100-times increase in conductivity and the minimum 100-times decrease in conductivity in the second current path occurs is no more than 25° C. between 300° C. and 800° C.

10. The device of claim 1 wherein the first and second current paths are directly against one another.

11. The device of claim 1 wherein the first and second current paths are not directly against one another.

12. The device of claim 1 wherein the second current path where between the two electrodes is homogenous.

13. The device of claim 1 wherein the second current path where between the two electrodes is non-homogenous.

14. The device of claim 1 wherein the device is a vertical device, and the first and second current paths are laterally aside one another.

15. The device of claim 1 wherein the second current path has conductivity of no more than 10 Siemens/cm below 300° C.

16. The device of claim 1 wherein the first current path predominantly comprises one or more of amorphous silicon, polycrystalline silicon, germanium, and chalcogenide glass.

17. The device of claim 1 wherein the second current path predominantly comprises one or more Mott insulators.

18. The device of claim 17 wherein the Mott insulator comprises a vanadium oxide.

19. The device of claim 1 wherein the second current path predominantly comprises one or more transition metal oxides.

20. The device of claim 1 wherein each of the two electrodes has a surface that faces the other electrode, the first current path being directly against each of said surfaces.

21. The device of claim 1 wherein each of the two electrodes has a surface that faces the other electrode, the first current path not being directly against each of said surfaces.

22. The device of claim 1 wherein each of the two electrodes has a surface that faces the other electrode, the second current path being directly against each of said surfaces.

23. The device of claim 1 wherein each of the two electrodes has a surface that faces the other electrode, the second current path not being directly against each of said surfaces.

24. The device of claim 1 wherein each of the two electrodes has a surface that faces the other electrode, the first current path and the second current path being directly against each of said surfaces.

25. The device of claim 1 wherein the first current path comprises an annulus that is circumferentially about the second current path.

26. The device of claim 25 wherein the annulus is circumferentially about each of the two electrodes.

27. The device of claim 1 wherein the second current path comprises an annulus that is circumferentially about the first current path.

28. The device of claim 27 wherein the annulus is circumferentially about each of the two electrodes.

29. A memory cell, comprising:
  a programmable memory device electrically coupled in series with a select device, the select device comprising:
    two conductive electrodes;
    a first current path from one of the electrodes to the other that has a dominant thermally activated conduction activation energy of 0.5 eV to 3.0 eV; and
    a second current path from the one electrode to the other that is circuit-parallel the first current path, the second current path exhibiting a minimum 100-times increase in electrical conductivity for increasing temperature within a temperature range of no more than 50° C. between 300° C. and 800° C. and exhibiting a minimum 100-times decrease in electrical conductivity for decreasing temperature within said 50° C. temperature range.

30. The memory cell of claim 29 wherein the programmable memory device is non-volatile.

31. The memory cell of claim 30 wherein the memory device comprises a ferroelectric capacitor.

32. The memory cell of claim 29 wherein the programmable memory device comprises two conductive electrodes having programmable material there-between, one of the two conductive electrodes of the select device and one of the two conductive electrodes of the memory device being a same shared electrode.

33. The memory cell of claim 29 wherein said temperature range within which the minimum 100-times increase in conductivity and the minimum 100-times decrease in conductivity in the second current path occurs is no more than 35° C. between 300° C. and 800° C.

34. The memory cell of claim 29 wherein said temperature range within which the minimum 100-times increase in conductivity and the minimum 100-times decrease in conductivity in the second current path occurs is no more than 25° C. between 300° C. and 800° C.

35. A method of flowing electric current, comprising:
  operating two circuit-parallel current paths that exist between two electrodes, one of the current paths exhibiting a minimum 100-times increase in electrical conductivity for increasing temperature within a temperature range of no more than 50° C. between 300° C. and 800° C. and exhibiting a minimum 100-times decrease in electrical conductivity for decreasing temperature within said 50° C. temperature range; and
  the operating comprising sequentially iterating the following:
    flowing current through the other current path between the two electrodes sufficient to heat the one current path within said 50° C. temperature range to increase conductivity in the one path by said minimum 100-times and which is then greater than any current flowing through said other current path; and reduced, if any, current flow through the other current path lowering temperature within the other current path until temperature within the one current path decreases within said 50° C. temperature range to decrease conductivity in the one path by said minimum 100-times.

\* \* \* \* \*